(12) United States Patent
De Cruz et al.

(10) Patent No.: US 11,574,816 B2
(45) Date of Patent: Feb. 7, 2023

(54) METHOD FOR MANUFACTURING ELECTRONIC CHIPS

(71) Applicant: STMicroelectronics (Tours) SAS, Tours (FR)

(72) Inventors: Michael De Cruz, Monnaie (FR); Olivier Ory, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 143 days.

(21) Appl. No.: 17/104,869

(22) Filed: Nov. 25, 2020

(65) Prior Publication Data
US 2021/0175094 A1 Jun. 10, 2021

(30) Foreign Application Priority Data
Dec. 4, 2019 (FR) ...................................... 1913744

(51) Int. Cl.
| | | |
|---|---|---|
| *H01L 21/44* | (2006.01) | |
| *H01L 21/48* | (2006.01) | |
| *H01L 21/56* | (2006.01) | |

(52) U.S. Cl.
CPC .......... *H01L 21/4853* (2013.01); *H01L 21/56* (2013.01)

(58) Field of Classification Search
CPC ............................ H01L 21/56; H01L 21/4853
USPC ........................................................ 438/113
See application file for complete search history.

(56) References Cited

U.S. PATENT DOCUMENTS

| | | | | |
|---|---|---|---|---|
| 4,640,721 A | * | 2/1987 | Uehara | ............. H01L 21/28525 |
| | | | | 438/564 |
| 5,606,198 A | * | 2/1997 | Ono | ........................ H01L 24/72 |
| | | | | 361/764 |
| 5,910,687 A | * | 6/1999 | Chen | ...................... H01L 23/481 |
| | | | | 257/784 |
| 6,326,689 B1 | * | 12/2001 | Thomas | ................ H01L 23/481 |
| | | | | 257/730 |
| 6,498,099 B1 | * | 12/2002 | McLellan | ............. H01L 21/561 |
| | | | | 438/754 |
| 7,935,568 B2 | * | 5/2011 | Oganesian | .............. H01L 24/16 |
| | | | | 438/106 |
| 8,278,213 B2 | * | 10/2012 | Kameyama | ......... H01L 23/3114 |
| | | | | 257/E21.597 |
| 8,551,815 B2 | * | 10/2013 | Avsian | .................... H01L 25/00 |
| | | | | 438/109 |
| 2003/0067001 A1 | | 4/2003 | Poo et al. | |
| 2005/0095750 A1 | | 5/2005 | Lo et al. | |

(Continued)

FOREIGN PATENT DOCUMENTS

| | | |
|---|---|---|
| EP | 1085570 A2 | 3/2001 |
| EP | 3154085 A1 | 4/2017 |

(Continued)

*Primary Examiner* — Nitin Parekh
(74) *Attorney, Agent, or Firm* — Seed IP Law Group LLP

(57) ABSTRACT

A method for manufacturing electronic chips includes forming, on the side of a first face of a semiconductor substrate, in and on which a plurality of integrated circuits has been formed beforehand, metallizations coupling contacts of adjacent integrated circuits to one another. The method further includes forming, on the side of the first face of the substrate, first trenches extending through the first face of the substrate and laterally separating the adjacent integrated circuits. The first trenches extend through the metallizations to form at least a portion of metallizations at each of the adjacent circuits.

20 Claims, 12 Drawing Sheets

(56) References Cited

U.S. PATENT DOCUMENTS

| | | |
|---|---|---|
| 2006/0012967 A1 | 1/2006 | Asai et al. |
| 2009/0243097 A1 | 10/2009 | Koroku et al. |
| 2010/0246152 A1 | 9/2010 | Lin et al. |
| 2011/0018116 A1 | 1/2011 | Feng |
| 2011/0189822 A1* | 8/2011 | Sasaki ................. H01L 21/78 |
| | | 257/E21.599 |
| 2011/0304008 A1 | 12/2011 | Yang |
| 2012/0034760 A1 | 2/2012 | Schuderer et al. |
| 2012/0178251 A1 | 7/2012 | Lim et al. |
| 2013/0161813 A1 | 6/2013 | Miki |
| 2014/0054796 A1* | 2/2014 | Gong .................... H01L 24/82 |
| | | 438/669 |
| 2015/0228557 A1 | 8/2015 | Cheng et al. |
| 2017/0025356 A1 | 1/2017 | Xue |
| 2017/0077022 A1 | 3/2017 | Scanlan et al. |
| 2017/0084686 A1 | 3/2017 | Wang et al. |
| 2017/0316957 A1 | 11/2017 | Chen et al. |
| 2017/0323840 A1 | 11/2017 | Chiu et al. |
| 2018/0005912 A1 | 1/2018 | Oh et al. |
| 2018/0008920 A1* | 1/2018 | Peterson, II ............ C02F 1/004 |
| 2018/0068920 A1 | 3/2018 | Leung et al. |
| 2018/0330966 A1 | 11/2018 | Scanlan et al. |
| 2020/0126877 A1 | 4/2020 | Takaoka |

FOREIGN PATENT DOCUMENTS

| | | |
|---|---|---|
| EP | 3211670 A1 | 8/2017 |
| EP | 3282476 A1 | 2/2018 |
| KR | 20030008646 A | 1/2003 |

\* cited by examiner (A)

(B)

METHOD FOR MANUFACTURING ELECTRONIC CHIPS

BACKGROUND

Technical Field

The present disclosure relates to a method for manufacturing electronic chips. It is more specifically directed to a method for manufacturing so-called surface-mount chips (SMD), i.e., comprising, on the side of at least one face, one or more connection metallizations intended to be soldered to connection areas of an external device, for example a printed circuit board or a further chip.

Description of the Related Art

In certain applications, there is a need for surface-mount chips in which the connection metallizations intended to be soldered to an external device extend up to the flanks of the chips. Such chips may be referred to as having wettable flanks. During soldering, a part of the soldering material rises onto the flanks of the chips, which makes is possible to carry out a visual inspection of the quality of the connections. This need also exists, for example, in fields such as the automotive field or the medical field.

BRIEF SUMMARY

It would desirable to improve at least partly certain aspects of the known methods for manufacturing electronic chips with wettable flanks.

An embodiment provides a method for manufacturing electronic chips comprising the following steps:

a) forming, on the side of a first face of a semiconductor substrate, in and on which a plurality of integrated circuits has been formed beforehand, metallizations coupling contacts of adjacent integrated circuits; and b) forming, on the side of said first face of the substrate, first trenches laterally separating the integrated circuits and cutting the metallizations coupling adjacent integrated circuits, in order to form at least a portion of metallizations at each of the adjacent circuits.

According to an embodiment, step a) is followed by step b).

According to an embodiment, the first trenches extend vertically in the substrate over a depth greater than that of the integrated circuits and less than the thickness of the substrate.

According to an embodiment, step b) is followed by a step c) of depositing a layer of a first resin over the entire first face, said first resin penetrating into the first trenches and covering said portions of said metallizations.

According to an embodiment, step c) is followed by a step d) of planarizing the first face until said portions of said metallizations are uncovered.

According to an embodiment, step d) is carried out until said portions of said metallizations are uncovered over a surface area sufficient in order to solder the chip, by its first face, onto a device different from the chip, the planarization in some embodiments being carried out until said portions of said metallizations are uncovered over a length greater than approximately 100 µm.

According to an embodiment, step a) is preceded by a step e) of forming second trenches on the side of the first face, laterally separating the integrated circuits, the second trenches extending vertically in the substrate over a depth greater than that of the integrated circuits and less than the thickness of the substrate.

According to an embodiment, step a) is followed by a step f) of depositing a layer of a first resin over the entire first face, said first resin penetrating into the second trenches and covering said portions of said metallizations.

According to an embodiment:

step e) is preceded by a step g) of forming bumps in vertical alignment with the integrated circuits; and between steps e) and a), a step h) is carried out in which a first layer of a first resin is deposited over the entire first face, said first resin penetrating into the second trenches and covering the bumps, and said first layer is planarized at least until the bumps are uncovered.

According to an embodiment, the metallizations are coupled to the integrated circuits by way of the bumps.

According to an embodiment, step a) is followed by a step i) of depositing a second layer of the first resin over the first layer of the first resin.

According to an embodiment, step f) or i) is followed by a step j) of planarizing the first face so as to uncover each metallization, said metallizations being uncovered over a length, for example, greater than approximately 200 µm.

According to an embodiment, step d) or j) is followed by a step k) of thinning the substrate by a second face of the substrate, located opposite the first face, at least until the first resin is reached, and of depositing a layer of a second resin over the second face.

According to an embodiment, step k) is followed by a step l) comprising the steps of:

partially removing the layer of the first resin, over a height less than or equal to the height of said portions of said metallizations, in order to form openings located across from the trenches and extending over a width greater than or equal to that of the trenches, so as to free a flank of at least a portion of each integrated circuit; and individualizing the chips by cutting along a cutting path in the first trenches, over a width less than the width of the first trenches.

According to an embodiment, step k) is followed by step b).

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the realization of the integrated circuits present in the described electronic chips has not been described in detail.

Unless indicated otherwise, when reference is made to two elements that are connected together, this means a direct connection without any intermediate elements other than conductors, and when reference is made to two elements that are coupled together, this means that these two elements can be connected or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and in some embodiments within 5%.

FIGS. 1 to 10 depict, in a schematic and partial fashion, successive steps of an example of a method for manufacturing electronic chips according to a first embodiment.

Figure 1:
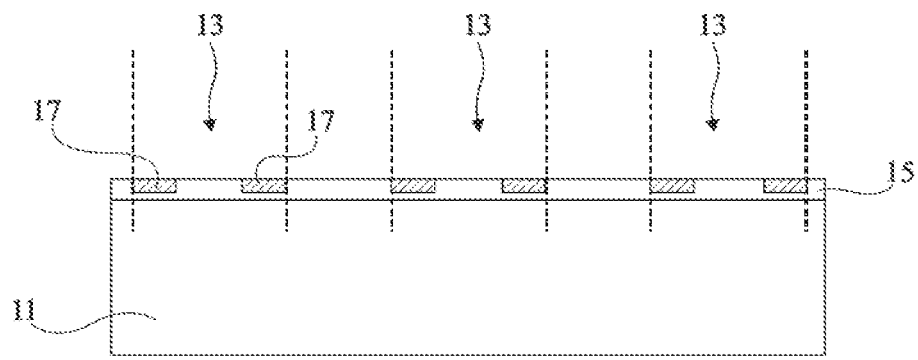
FIG. 1 depicts, via a sectional view, a step of a method for manufacturing electronic chips according to a first embodiment.

FIG. 1 depicts, via a sectional view, a step of the method for manufacturing electronic chips according to this first embodiment.

More specifically, FIG. 1 is a partial and schematic view of an initial structure comprising a semiconductor substrate 11 in and on which integrated circuits 13 have been formed beforehand. The circuits 13 are, for example, all identical with the exception of the manufacturing dispersions. The substrate 11 can correspond to a wafer of a semiconductor material, for example silicon. The substrate 11 has, for example, a thickness comprised between approximately 50 µm and approximately 900 µm, for example a thickness of approximately 200 µm.

In the following description, the upper face of the structure, in the orientation shown in FIG. 1, is considered the front face, and the lower face of the structure, in the orientation shown in FIG. 1, is considered the rear face.

The structure shown in FIG. 1 further comprises a stack of conductive and isolating layers 15, called interconnection stack, covering the upper face of the substrate 11. Elements for interconnecting the components of each circuit 13 are formed in this stack 15. The interconnection stack 15 comprises in particular, for each integrated circuit 13, one or more metal contact pads 17 flush with the upper face of the integrated circuits 13 and intended to be connected to a device external to the realized chip.

Each integrated circuit 13 comprises, for example, one or more electronic components (transistors, diodes, thyristors, triacs, etc.).

In FIG. 1, three integrated circuits 13 have been illustrated, it being understood that, in practice, the number of integrated circuits 13 formed in and on the substrate 11 can be much higher.

Figure 2:
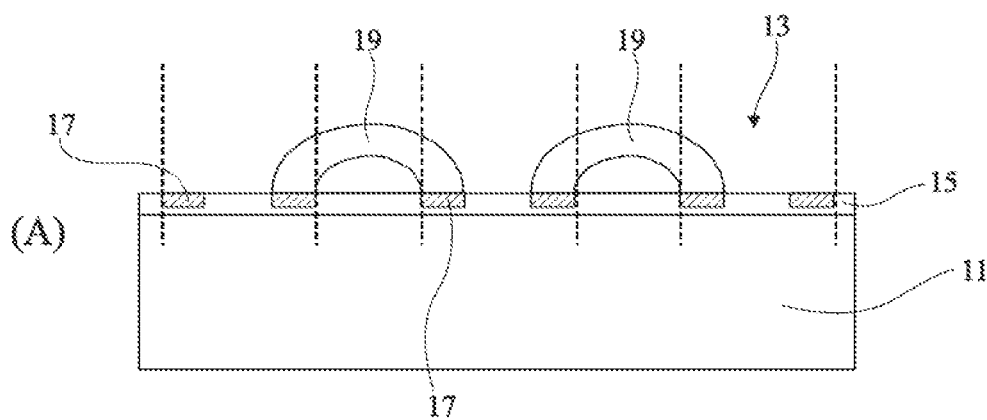
FIG. 2 depicts, via views (A) and (B), respectively a sectional view and a top view, a further step of the method for manufacturing electronic chips according to the first embodiment.
Figure 2:
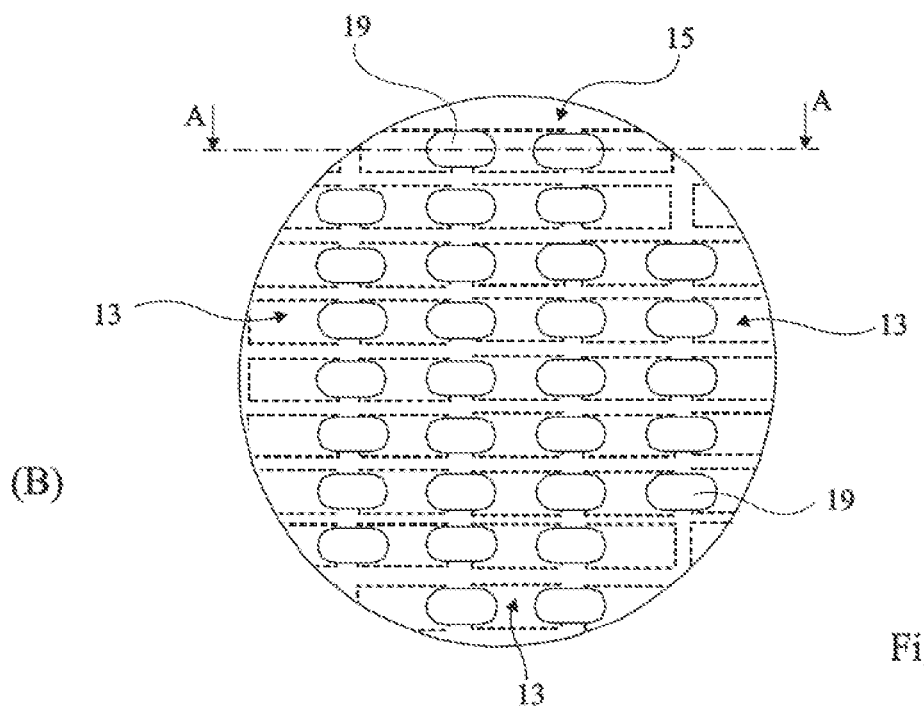

FIG. 2 depicts, via views (A) and (B), respectively a sectional view and a top view, a further step of the method for manufacturing electronic chips according to the first embodiment.

More specifically, FIG. 2 depicts via partial and schematic views a step of forming connection metallizations 19 on and in contact with the metal pads 17 of two adjacent circuits 13. The view (A) corresponds to a sectional view, according to the sectional plane A-A indicated in the view (B).

The metallizations 19 are manufactured by a metal deposition, on and in contact with the pads 17, through a mask (not shown). In the embodiment shown in FIG. 2, the openings of the mask (not shown) are intentionally misaligned with respect to the position of the underlying contact pads 17. More specifically, openings of the mask (not shown) are intentionally positioned between two contact pads 17 of two adjacent circuits 13 so that each opening is positioned across from a part of each of the two pads 17 of said two adjacent circuits 13.

The metal, guided by an opening of the mask (not shown) between two pads 17 of two adjacent circuits 13, is deposited on said two contact pads 17 while coupling them to form a bridge. The two bases of the bridge are each in contact with a contact pad 17 of one of said two adjacent circuits 13.

This phenomenon linked to the misalignment of the mask is generally undesirable as it short-circuits two contact pads 17. In the present embodiment, this phenomenon is exploited by encouraging it so as to form a bridge or a part of a conductive ring coupling two contacts 17 of two separate circuits 13.

Each metallization 19 is thus elongated between the two pads 17 of the two adjacent circuits 13 that it couples.

In practice, the opening of the mask is circular, square or elongated in the direction coupling the two contacts 17.

The metallizations 19 can be made of a tin-based alloy, for example an alloy based on tin and silver (SnAg).

For instance, the metallizations 19 are all oriented in the same direction (view (B)).

In practice, the substrate 11 can comprise a plurality of identical integrated circuits 13, all intended to become chips with wettable flanks, arranged over the entire structure. The circuits located on the edge of the semiconductor wafer are incomplete due to the usual circular shape of the wafer. These incomplete circuits are generally lost. In the described embodiment, however, their contacts across from the contacts of adjacent complete circuits are used to form bridges with the latter.

Figure 3:
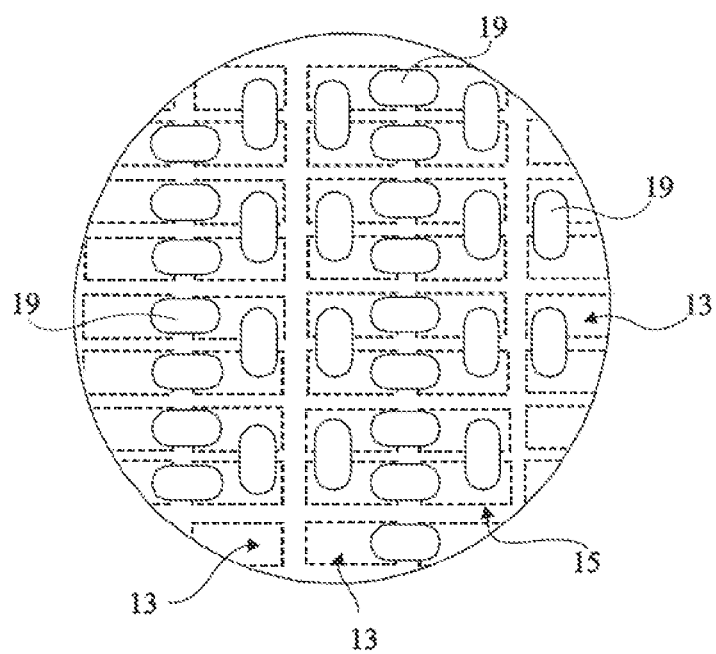
FIG. 3 depicts, via a top view, an alternative of the step shown in FIG. 2.

FIG. 3 depicts, via a top view, an alternative of the step shown in FIG. 2.

The structure depicted in FIG. 3 differs from that depicted in FIG. 2 (view (B)) by the fact that the metallizations 19 are oriented in orthogonal directions. More generally, the metallizations 19 can be realized obliquely with respect to the alignment of the circuits, or couple contacts 17 of the corners of two adjacent circuits 13.

Figure 4:
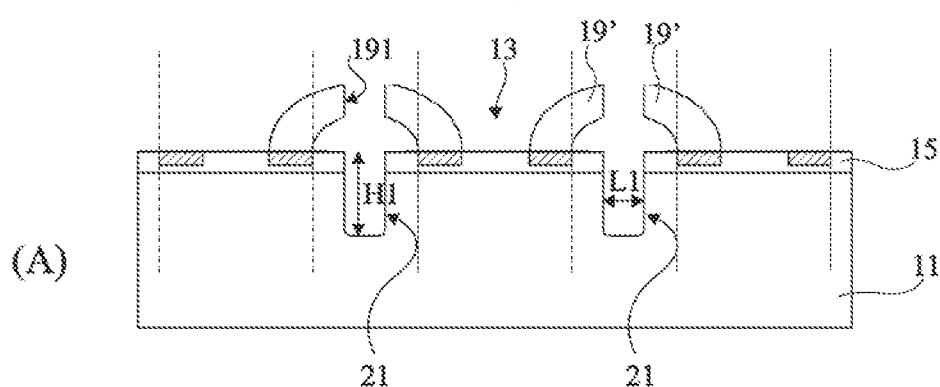
FIG. 4 depicts, via views (A) and (B), respectively a sectional view and a top view, a further step of the method for manufacturing electronic chips according to the first embodiment.
Figure 4:
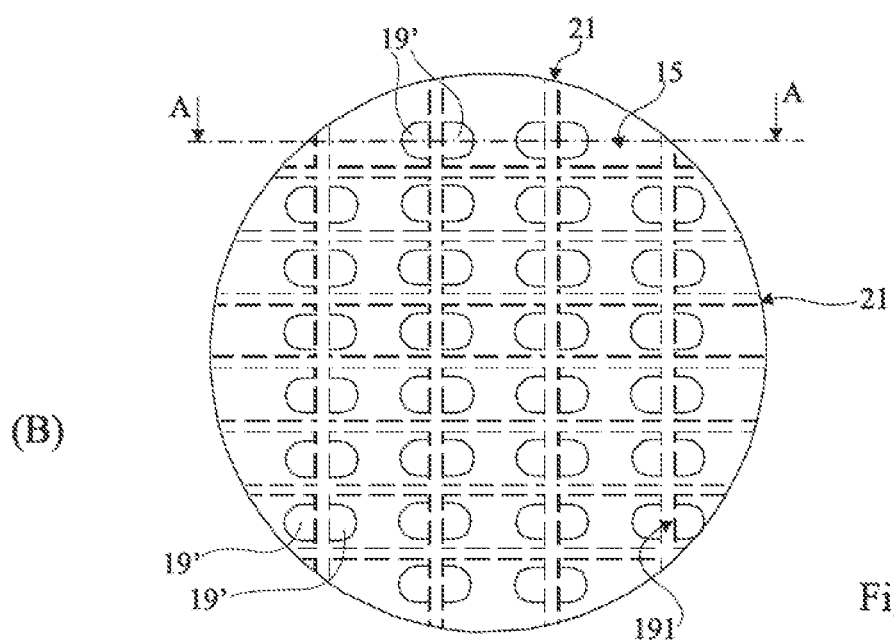

FIG. 4 depicts, via views (A) and (B), respectively a sectional view and a top view, a further step of the method for manufacturing electronic chips according to the first embodiment.

More specifically, FIG. 4 depicts via partial and schematic views a step of forming first trenches 21 in the upper face of the structure obtained at the end of the steps shown in FIGS. 1 to 3. The view (A) corresponds to a sectional view, according to the sectional plane A-A indicated in the view (B).

The first trenches 21 extend between the circuits 13 so that, when viewed from above, each circuit 13 is separated from its neighbor by a trench 21. For instance, each circuit 13 is entirely delimited, laterally, by trenches 21. The trenches can, for example, when viewed from above, form a continuous grid extending between the integrated circuits 13.

In the illustrated example, the trenches 21 extend vertically, from the upper face of the stack 15, and continue into the substrate 11, over a depth greater than the depth of the integrated circuits 13. The trenches 21 extend vertically.

The trenches 21 are, for example, realized by sawing. During the sawing step, the structure can be mounted on a support film, not illustrated, disposed on the side of the lower face of the substrate 11, the film then being removed after the formation of the trenches 21.

The sawing operation cuts the metallizations 19 in line with the trenches 21, so as to separate each metallization 19 into two portions 19' of metallization 19. This separation causes flanks 191 to appear on either side of the trenches 21 on the portions 19'.

In other words, the metallizations 19 are cut in order to form at least one portion 19' of metallizations 19 at each of the adjacent circuits 13.

In this example, the trenches 21 are non-through, i.e., they do not exit on the lower side of the substrate 11. The trenches 21 extend vertically over a depth H1, for example comprised between approximately 30 µm and approximately 400 µm, in some embodiments comprised between approximately 100 µm and approximately 200 µm. The trenches 21 have, for example, a width L1 comprised between approximately 5 µm and approximately 100 µm, in some embodiments between approximately 30 µm and approximately 40 µm, the width L1 in some embodiments being equal to approximately 35 µm, for example equal to 35 µm.

Figure 5:
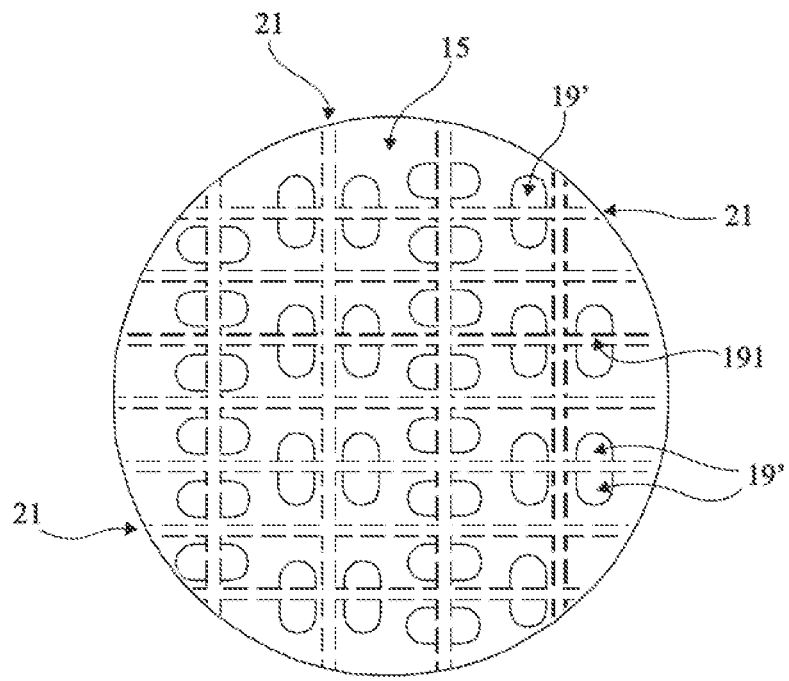
FIG. 5 depicts, via a top view, an alternative of the step shown in FIG. 4.

FIG. 5 depicts, via a top view, an alternative of the step shown in FIG. 4.

The structure depicted in FIG. 5 differs from that depicted in FIG. 4 (view (B)) by the fact that the step of forming the trenches 21 is carried out based on the structure depicted in FIG. 3.

Figure 6:
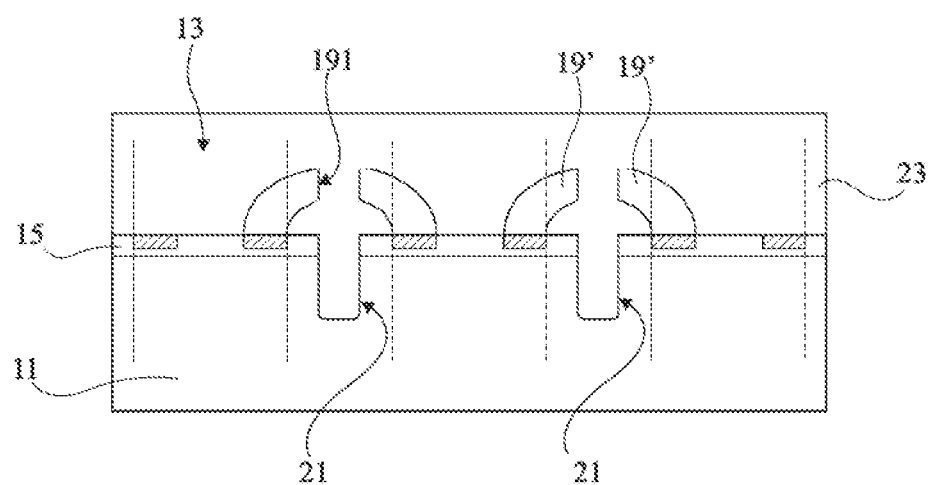
FIG. 6 depicts, via a sectional view, a further step of the method for manufacturing electronic chips according to the first embodiment.

FIG. 6 depicts, via a sectional view, a further step of the method for manufacturing electronic chips according to the first embodiment.

More specifically, FIG. 6 depicts via a partial and schematic view a step of depositing an insulating layer, which in some embodiments may be a first layer 23 of a first resin, on the upper face of the structure obtained at the end of the steps shown in FIGS. 1 to 5.

The front face of the structure is entirely covered (full wafer), and in particular the trenches 21 are filled and the stack 13 and the portions 19' of the metallizations 19 are covered by the layer 23. The first resin is, for example, an epoxy resin.

Figure 7:
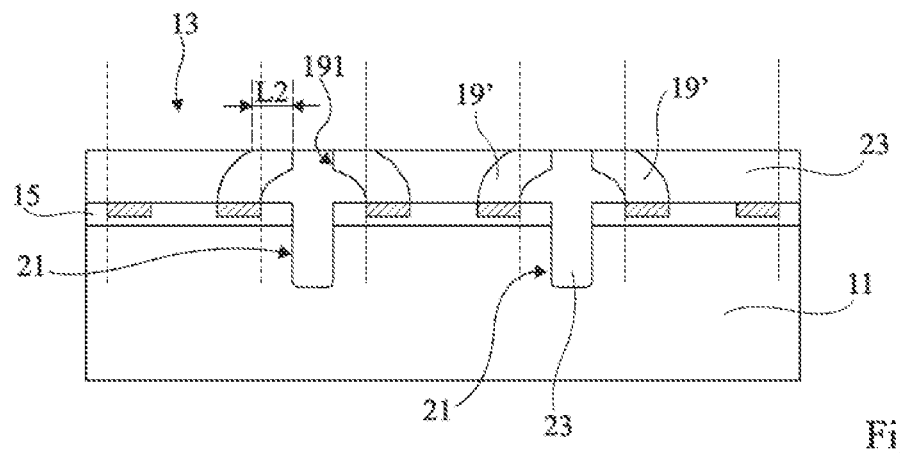
FIG. 7 depicts, via a sectional view, a further step of the method for manufacturing electronic chips according to the first embodiment.

FIG. 7 depicts, via a sectional view, a further step of the method for manufacturing electronic chips according to the first embodiment.

More specifically, FIG. 7 depicts via a partial and schematic view, a step of planarizing the front face of the structure obtained at the end of the steps shown in FIGS. 1 to 6, for example by chemical mechanical polishing (CMP). During this step, an upper part of the layer 23 is removed, so as to uncover the portions 19' of the metallizations 19. More specifically, the planarization is carried out until the portions 19' are uncovered over a length L2 (in the plane of the chip) greater than 20 μm and over a width greater than 100 μm.

The length L2 is, for example, comprised between approximately 20 μm and approximately 600 μm, in some embodiments comprised between approximately 100 μm and approximately 500 μm. The width of the portions 19' is, for example, comprised between approximately 100 μm and approximately 600 μm, in some embodiments comprised between approximately 100 μm and approximately 400 μm. These dimensions are chosen as a function of the width of the trenches 21 and of the dimensions of the contact pads 17.

Figure 8:
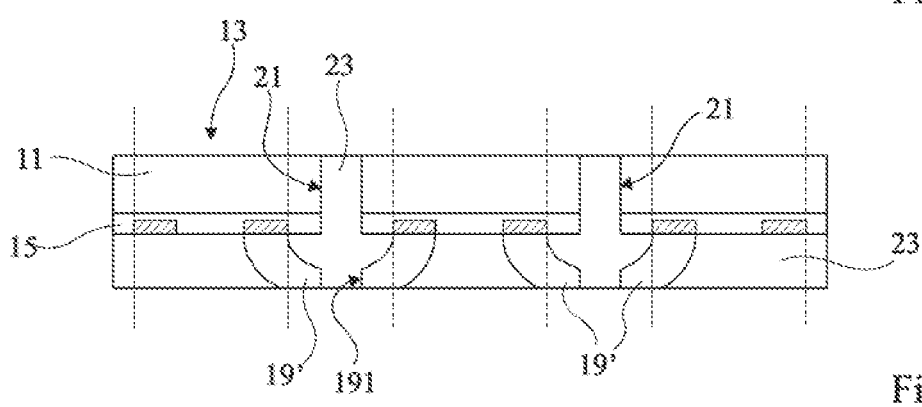
FIG. 8 depicts, via a sectional view, a further step of the method for manufacturing electronic chips according to the first embodiment.

FIG. 8 depicts, via a sectional view, a further step of the method for manufacturing electronic chips according to the first embodiment.

More specifically, FIG. 8 depicts via a partial and schematic view a step of thinning the structure obtained at the end of the steps shown in FIGS. 1 to 7, via its rear face.

It should be noted that, in the example shown in FIG. 8, the orientation of the structure is reversed with respect to the sectional views shown in the preceding figures.

The substrate 11 is thinned via its rear face (upper face in FIG. 8), for example by chemical mechanical polishing (CMP). In this example, the substrate 11 is thinned via its rear face until at least the bottom of the trenches 21 is reached, so that, after thinning, the first resin present in the trenches 21 is flush with the rear face of the substrate 11. At the end of this step, the integrated circuits 13 are only coupled to one another via what remains of the layer 23 and the support film (not illustrated in FIG. 8).

Figure 9:
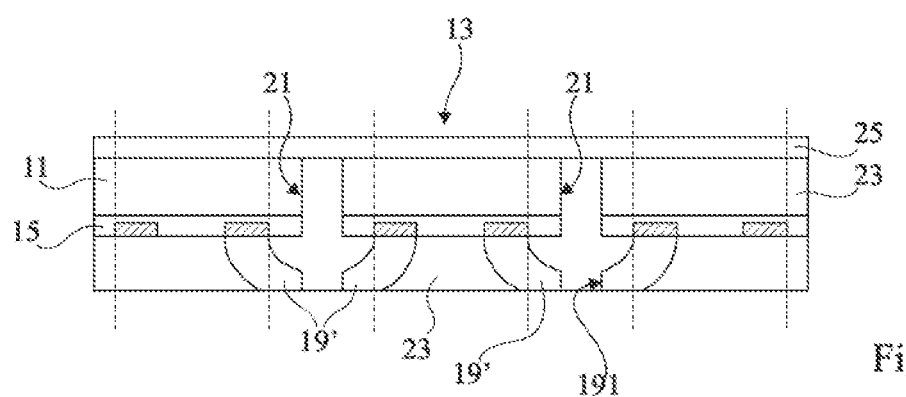
FIG. 9 depicts, via a sectional view, a further step of the method for manufacturing electronic chips according to the first embodiment.

FIG. 9 depicts, via a sectional view, a further step of the method for manufacturing electronic chips according to the first embodiment.

More specifically, FIG. 9 is a partial and sectional view, in the same orientation as FIG. 8, depicting a step of depositing a second layer 25 of a second resin on the rear face of the structure obtained at the end of the steps shown in FIGS. 1 to 8.

The layer 25 of second resin extends, for example full wafer, in a continuous fashion and with a substantially constant thickness over the entire surface area of the rear face of the structure. The layer 25 of second resin has, for example, a thickness comprised between approximately 10 μm and a thickness according to the box final dimension. The thickness of the layer 25 is, in some embodiments, comprised between approximately 10 μm and approximately 100 μm, for example, in the order of approximately 25 μm. The second resin can be an epoxy resin. The first and second resins can be of the same composition or different compositions.

Figure 10:
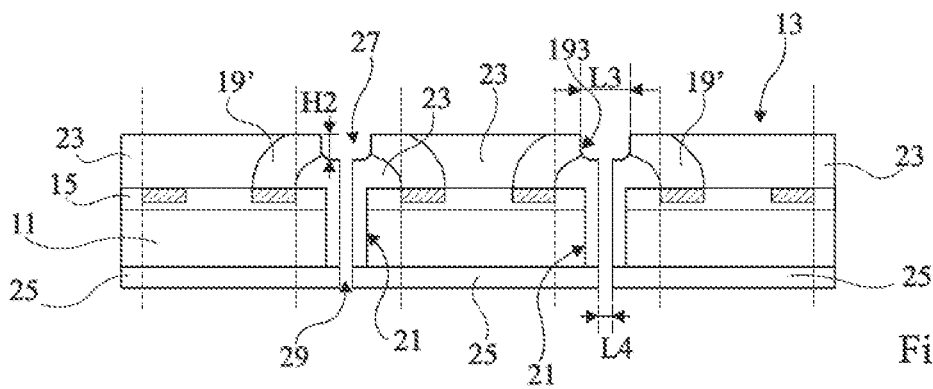
FIG. 10 depicts, via a sectional view, a further step of the method for manufacturing electronic chips according to the first embodiment.

FIG. 10 depicts, via a sectional view, a further step of the method for manufacturing electronic chips according to the first embodiment.

More specifically, FIG. 10 depicts via a partial and schematic view a step of forming, on the side of the front face of the structure obtained at the end of the steps shown in FIGS. 1 to 9, openings 27 and a step of cutting the structure into individual chips each comprising a single integrated circuit 13. Prior to this step, the structure is placed, by its rear face, on a support film 21, not illustrated in FIG. 10.

Each opening 27 is realized, across from a first trench 21, locally between two portions 19' stemming from a same metallization 19 (FIG. 2). Openings 27 can, as an alternative, be realized across from all the trenches 21 and over their entire length.

In order to realize the openings 27, a partial removal of the first resin (layer 23) located above the first trenches 21 is realized. The partial removal of the first resin is possibly accompanied by a removal of a part of the portions 19' located, when viewed from above, on either side of the trenches 21, thus reducing the length L2 (FIG. 7) of the portions 19'. The openings 27 can be, for example, trenches parallel to the underlying trench 21. The openings 27 extend, for example, over the entire length of the underlying trench 21.

The formation of the openings causes the appearance of flanks 193 which correspond to the wettable metal flanks of the chips manufactured according to this embodiment.

The openings 27 extend vertically, from the front face of the structure, over a depth H2 and a width L3. The depth H2 is determined so as to optimize the soldering of the chips on the external device and the visual inspection of the solder. For instance, the depth H2 is thus less than or equal to the residual height (distance between the upper face of the stack 15 and the upper face of the layer 23 of the first resin) of the portions 19' of metallizations 19. The depth H2 is in some embodiments greater than the residual height of the flanks 191 (FIG. 9) of the portions 19'. The depth H2 is, for example, comprised between approximately 20 μm and approximately 400 μm, in some embodiments, in the order of approximately 100 μm.

The flanks 193 correspond either to the flanks 191 reduced in height by the step shown in FIG. 7, or to flanks set back if the width L3 is greater than the gap between the two flanks 191 of the preceding steps.

The width L3 is chosen, like the depth H2, so as to optimize the soldering of the chips on the external device and the visual inspection of the solder. More specifically, in this example, the width L3 of the openings 27 is chosen, on the one hand, to be sufficiently large in order to allow a clearing of the first resin from the flanks 193 of the portions 19' of each integrated circuit 13. On the other hand, the width L3 should generally be small enough for a visual inspection of the subsequent soldering material, rising on the flanks 193 of each metallization portion 19', to be feasible. Indeed, if the width L3 is too great, the layer 23 of the first resin can interfere with the inspection. The width L3 should, moreover, be small enough to clear only the flank 193 of the portion 19' or cut into the metallization portion 19' without removing it over its entire length.

Thus, the openings 27 have a width L3, for example comprised between approximately 10 μm and approximately 150 μm, in some embodiments comprised between approximately 40 μm and approximately 60 μm, the width L3 in some embodiments being equal to approximately 50 μm, for example equal to 50 μm.

The openings 27 can, for example, be realized by sawing, by using a cutting blade with a width greater than the one used for the realization of the first trenches 21. The openings 27 can, as an alternative, be realized by laser ablation.

After the formation of the openings 27, a flank 193 of each portion 19' is exposed.

In order to cut the structure into individual chips each comprising a single integrated circuit 13, cutting lines 29 are realized in the first (layer 23) and second (layer 25) resins, across from the first trenches 21 and the openings 27. More specifically, in this example, a cutting line 29 is formed across from each first trench 21 parallel to said first trench 21. In this example, the cuts 29 extend over the entire length of the first trench 21. The cutting lines 29 extend, vertically, from the upper face of the structure to the lower face of the layer 23, and exit on the rear face. The width L4 of the cutting lines 29 is less than that of the trenches 21 so that each chip remains covered by the first resin (layer 23) on its four lateral faces. The width L4 of the cutting lines 29 is, for example, comprised between approximately 10 μm and approximately 50 μm, in some embodiments comprised between approximately 20 μm and approximately 30 μm, the width L4 in some embodiments being equal to approximately 25 μm, for example equal to 25 μm.

The cuts 29 can, for example, be realized by sawing, by using a cutting blade with a width less than the one used for the realization of the trenches 21. The cuts 29 can, as an alternative, be realized by laser ablation.

At the end of this step, the obtained structure corresponds to a plurality of electronic chips coupled solely by the support film 10 (not illustrated in FIG. 10).

The chips can then be taken from this support film with a view to their mounting in an external device.

As an alternative, the manufacture of the openings 27 can be carried out from the end of the step depicted in FIG. 6.

FIGS. 11 to 18 depict, in a schematic and partial fashion, successive steps of an example of the method for manufacturing electronic chips according to the second embodiment.

The second embodiment differs from the first embodiment essentially by the fact that trenches 31 or grooves, substantially identical to the first trenches 21 of the first embodiment, are realized before the formation of the metallizations 19.

Figure 11:
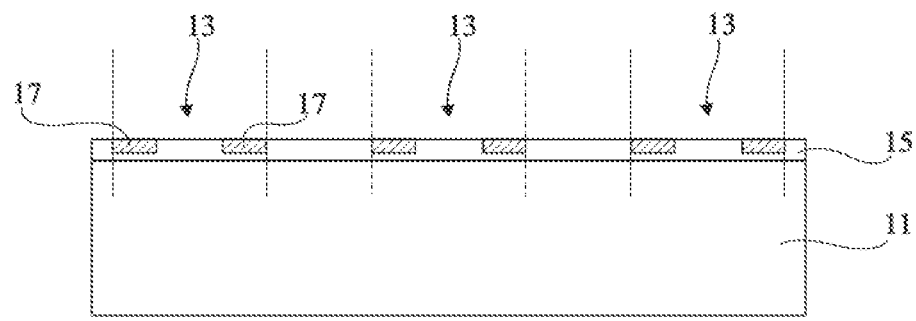
FIG. 11 depicts, via a sectional view, a step of a method for manufacturing electronic chips according to a second embodiment.

FIG. 11 depicts, via a sectional view, a step of the method for manufacturing electronic chips according to a second embodiment.

More specifically, FIG. 11 depicts via a partial and schematic view an initial structure identical to the initial structure of the method according to the first embodiment, illustrated in FIG. 1.

Figure 12:
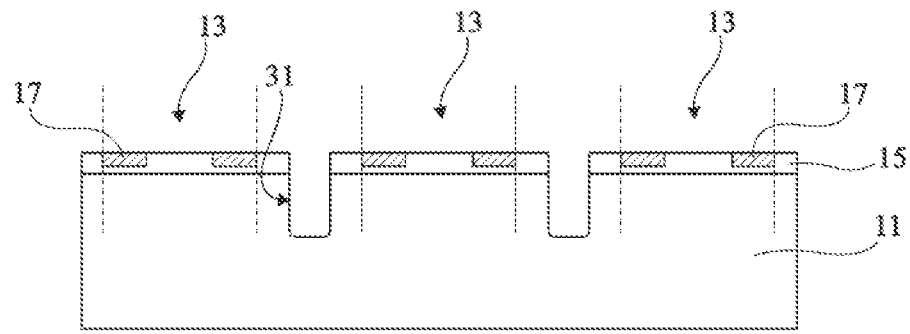
FIG. 12 depicts, via a sectional view, a further step of the method for manufacturing electronic chips according to the second embodiment.

FIG. 12 depicts, via a sectional view, a further step of the method for manufacturing electronic chips according to the second embodiment.

More specifically, FIG. 12 depicts via a partial and schematic view a step of forming non-through grooves 31, or second trenches, in the front face of the structure obtained at the end of the step shown in FIG. 11.

The grooves 31, formed in the second embodiment in the step depicted in FIG. 12, are substantially identical to the first trenches 21 formed in the first embodiment in the step illustrated in FIG. 4, with the difference that the grooves 31 are formed before the realization of the metallizations 19.

Figure 13:
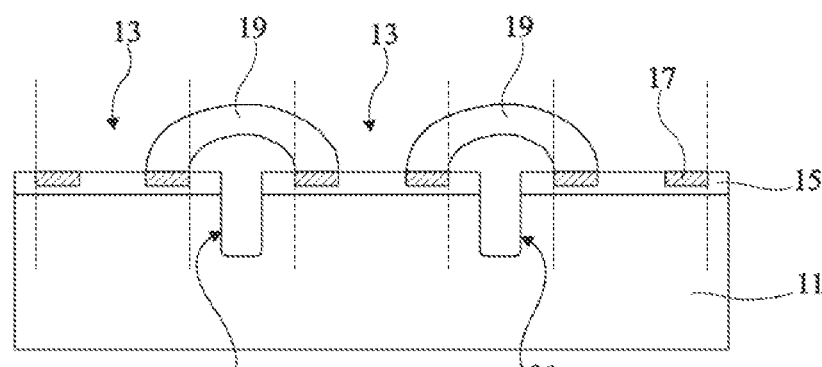
FIG. 13 depicts, via a sectional view, a further step of the method for manufacturing electronic chips according to the second embodiment.

FIG. 13 depicts, via a sectional view, a further step of the method for manufacturing electronic chips according to the second embodiment.

More specifically, FIG. 13 depicts via a partial and schematic view a step of forming, on the side of the front face of the structure obtained at the end of the steps shown in FIGS. 11 to 12, metallizations 19 on and in contact with the metal pads 17 of two adjacent circuits 13.

The metallizations 19, formed in the second embodiment in the step depicted in FIG. 13, are substantially identical to the metallizations 19 formed in the first embodiment in the step illustrated in FIG. 2, with the difference that, in the second embodiment, the metallizations are realized after grooves 31.

Figure 14:
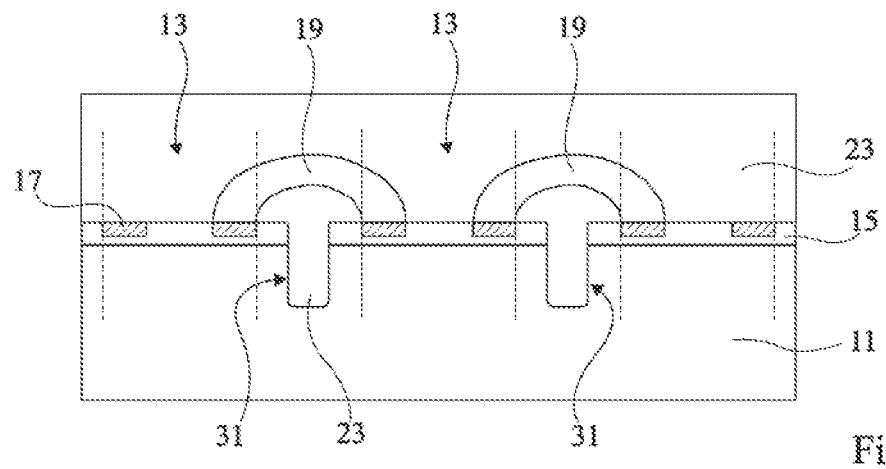
FIG. 14 depicts, via a sectional view, a further step of the method for manufacturing electronic chips according to the second embodiment.

FIG. 14 depicts, via a sectional view, a further step of the method for manufacturing electronic chips according to the second embodiment.

More specifically, FIG. 14 depicts via a partial and schematic view a step of depositing a first layer 23 of a first resin on the upper face of the structure obtained at the end of the steps shown in FIGS. 11 to 13.

This step is substantially identical to the step depicted in FIG. 6 of the method according to the first embodiment with the difference that, in the step depicted in FIG. 14, the layer 23 of the first resin covers inter alia the metallizations 19 and not the portions 19'.

Figure 15:
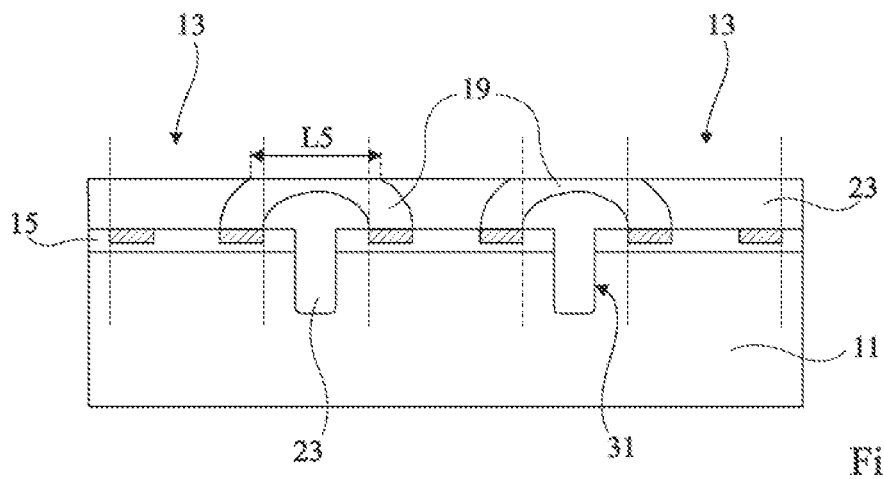
FIG. 15 depicts, via a sectional view, a further step of the method for manufacturing electronic chips according to the second embodiment.

FIG. 15 depicts, via a sectional view, a further step of the method for manufacturing electronic chips according to the second embodiment.

More specifically, FIG. 15 depicts via a partial and schematic view, a step of planarizing the front face of the structure obtained at the end of the steps shown in FIGS. 11 to 14, for example by chemical mechanical polishing (CMP).

During this step, an upper part of the layer 23 of the first resin is removed, so as to uncover the metallizations 19. More specifically, the planarization is carried out to uncover the metallizations 19 over a width greater than 50 μm and over a length L5 (in the plane of the chip) chosen as a function of the length that is desired to remain on the final chips, in order to allow a soldering of the chip onto the external device. At the end of this step, each metallization 19 is uncovered over a length L5 greater than approximately 50 μm, for example, comprised between approximately 50 μm and approximately 1270 μm, in some embodiments comprised between approximately 300 μm and approximately 1040 μm. The width of the metallizations 19 is greater than approximately 100 μm, for example, comprised between approximately 100 μm and approximately 600 μm, in some embodiments comprised between approximately 100 μm and approximately 400 μm.

These dimensions are chosen as a function of the width of the grooves 31 and of the dimensions of the contact pads 17.

Figure 16:
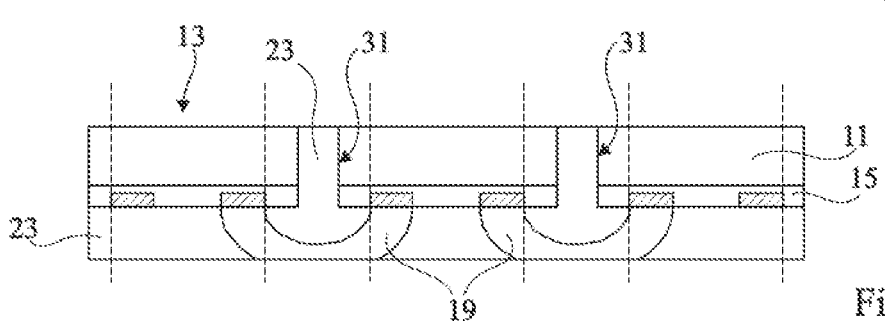
FIG. 16 depicts, via a sectional view, a further step of the method for manufacturing electronic chips according to the second embodiment.

FIG. 16 depicts, via a sectional view, a further step of the method for manufacturing electronic chips according to the second embodiment.

Figure 17:
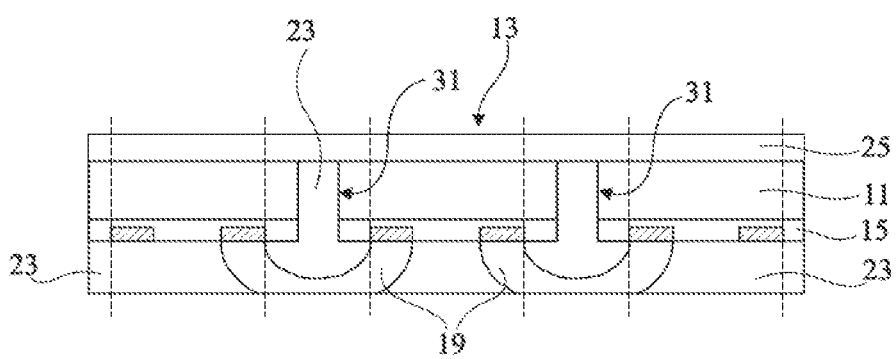
FIG. 17 depicts, via a sectional view, a further step of the method for manufacturing electronic chips according to the second embodiment.

FIG. 17 depicts, via a sectional view, a further step of the method for manufacturing electronic chips according to the second embodiment.

More specifically, FIGS. 16 and 17 depict via partial and schematic views a step of thinning the structure, obtained at the end of the steps shown in FIGS. 11 to 15, via its rear face, and a step of depositing a second layer 25 of a second resin, on the rear face of the structure.

It should be noted that, in the example shown in FIGS. 16 and 17, the orientation of the structures is reversed with respect to the sectional views shown in the preceding figures.

These two steps are substantially identical to the steps respectively depicted in FIGS. 8 and 9 of the method according to the first embodiment.

Figure 18:
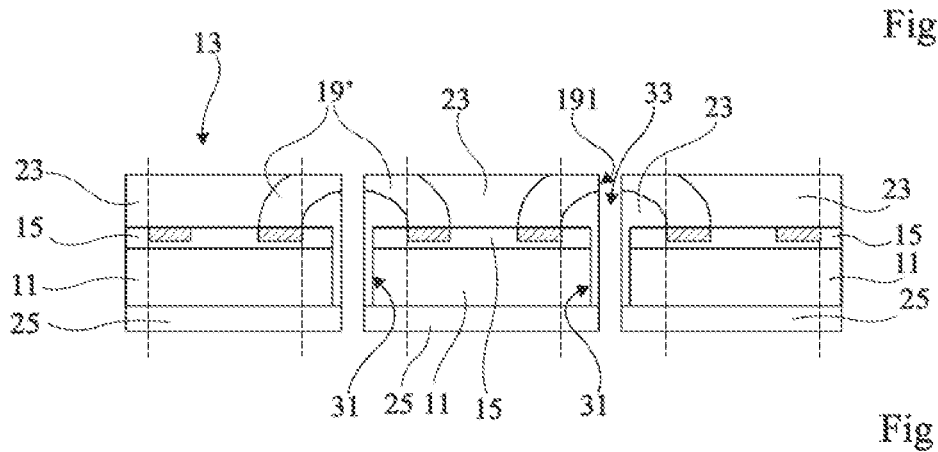
FIG. 18 depicts, via a sectional view, a further step of the method for manufacturing electronic chips according to the second embodiment.

FIG. 18 depicts, via a sectional view, a further step of the method for manufacturing electronic chips according to the second embodiment.

More specifically, FIG. 18 depicts via a partial and schematic view a step of cutting the structure into individual chips each comprising a single integrated circuit 13.

Prior to this step, the structure is fixed, via its rear face, on a support film 21, not illustrated in FIG. 18.

In order to cut the structure into individual chips each comprising a single integrated circuit 13 and separate each metallization 19 into two metallization portions 19', first trenches 33 are realized in the first and second resins, across from the grooves 31.

In this step, the first trenches 33 are substantially identical to the cutting lines 29 realized in the step shown in FIG. 10, with the difference that the formation of the first trenches 33 is sufficient (without forming openings 27) to uncover on at least one flank 191 of each chip a metal surface stemming from the metallizations 19.

At the end of this step, the obtained structure corresponds to a plurality of electronic chips coupled solely by the support film 18 (not illustrated in FIG. 10). The chips can then be taken from the support film with a view to their mounting in or on an external device.

FIGS. 19 to 28 depict, in a schematic and partial fashion, successive steps of an example of the method for manufacturing electronic chips according to the third embodiment.

The third embodiment differs from the second embodiment essentially by the manner of implementing the metallizations 19.

Figure 19:
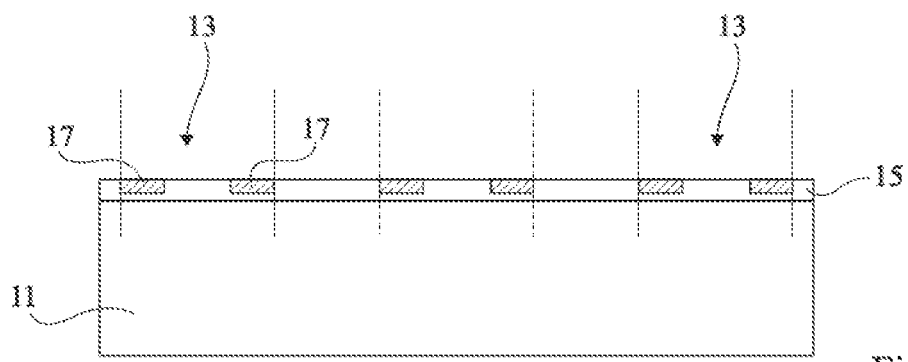
FIG. 19 depicts, via a sectional view, a step of a method for manufacturing electronic chips according to a third embodiment.

FIG. 19 depicts, via a sectional view, a step of the method for manufacturing electronic chips according to a third embodiment.

More specifically, FIG. 19 depicts via a partial and schematic view an initial structure identical to the initial structure of the method according to the second embodiment, illustrated in FIG. 11.

Figure 20:
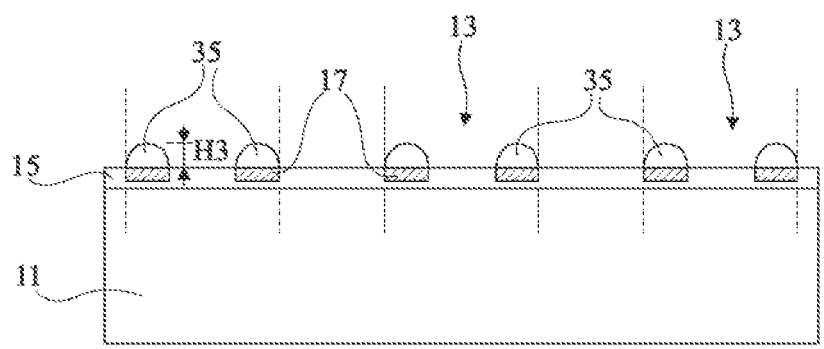
FIG. 20 depicts, via a sectional view, a further step of the method for manufacturing electronic chips according to the third embodiment.

FIG. 20 depicts, via a sectional view, a further step of the method for manufacturing electronic chips according to the third embodiment.

More specifically, FIG. 20 depicts via a partial and schematic view a step of forming conductive bumps 35 on and in contact with the metal pads 17.

In this example, a bump 35 is formed on each pad 17. Each bump 35 extends, for example, when viewed from above, over the entire surface of the underlying pad 17. The height H3 of the bumps 35 is, for example, comprised between approximately 1 µm and approximately 300 µm. The bumps 35 can, for example, be formed by electrolytic growth. The bumps 35 can be made of a tin-based alloy, for example an alloy based on tin and silver (SnAg).

Figure 21:
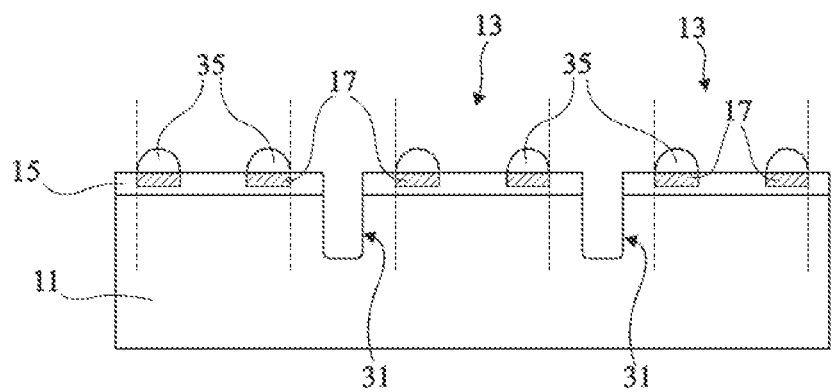
FIG. 21 depicts, via a sectional view, a further step of the method for manufacturing electronic chips according to the third embodiment.

FIG. 21 depicts, via a sectional view, a further step of the method for manufacturing electronic chips according to the third embodiment.

More specifically, FIG. 21 depicts via a partial and schematic view a step of forming non-through grooves 31 or second trenches in the upper face of the structure obtained at the end of the step shown in FIGS. 19 and 20.

The grooves 31, formed in the third embodiment in the step depicted in FIG. 21, are substantially identical to the grooves 31 formed in the second embodiment in the step depicted in FIG. 12.

Figure 22:
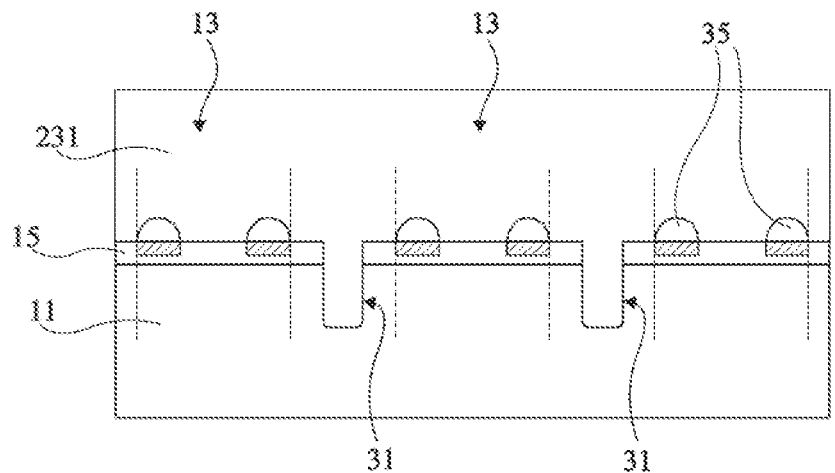
FIG. 22 depicts, via a sectional view, a further step of the method for manufacturing electronic chips according to the third embodiment.

FIG. 22 depicts, via a sectional view, a further step of the method for manufacturing electronic chips according to the third embodiment.

More specifically, FIG. 22 depicts via a partial and schematic view a step of depositing a first layer 231 of a first resin on the front face of the structure obtained at the end of the steps shown in FIGS. 19 to 21.

More specifically, the front face of the structure is entirely covered (full wafer) and, in particular, the grooves 31 are filled and the stack 13 and the bumps 35 are covered by the first layer 231 of the first resin. The first resin is, for example, an epoxy resin.

Figure 23:
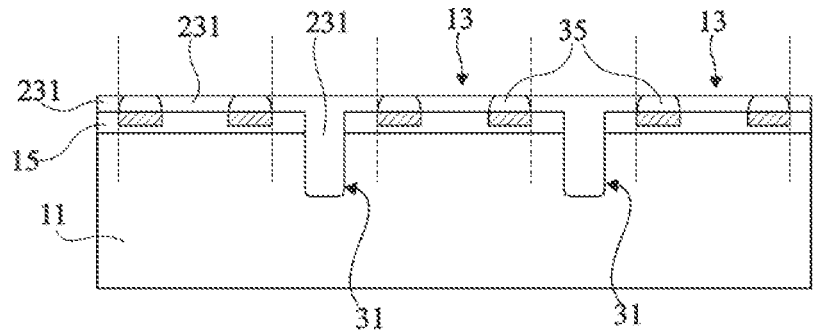
FIG. 23 depicts, via a sectional view, a further step of the method for manufacturing electronic chips according to the third embodiment.

FIG. 23 depicts, via a sectional view, a further step of the method for manufacturing electronic chips according to the third embodiment.

More specifically, FIG. 23 depicts via a partial and schematic view, a step of planarizing the front face of the structure obtained at the end of the steps shown in FIGS. 19 to 22, for example by chemical mechanical polishing (CMP). During this step, an upper part of the first resin is removed, so as to uncover the bumps 35. More specifically, the planarization is carried out until the bumps 35 are uncovered, for example, over a surface area greater than 10 µm×10 µm.

Figure 24:
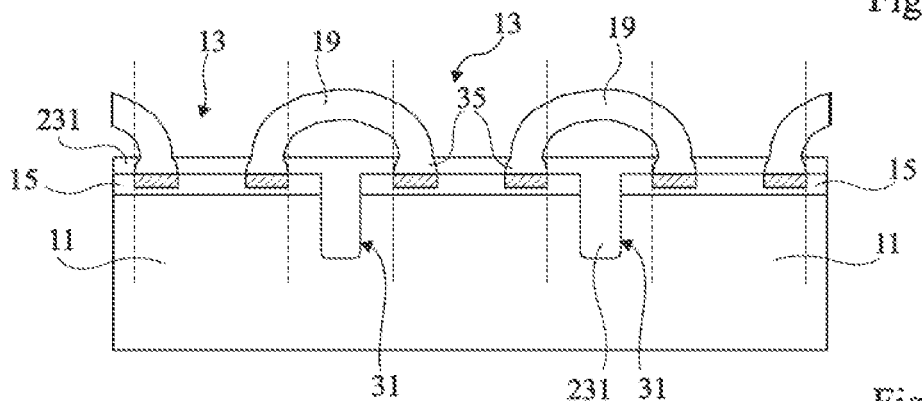
FIG. 24 depicts, via a sectional view, a further step of the method for manufacturing electronic chips according to the third embodiment.

FIG. 24 depicts, via a sectional view, a further step of the method for manufacturing electronic chips according to the third embodiment.

More specifically, FIG. 24 depicts via a partial and schematic view a step of forming, on the side of the front face of the structure obtained at the end of the steps shown in FIGS. 19 to 23, metallizations 19 on and in contact with the bumps 35 of two pads 17 of two adjacent circuits 13.

In the embodiment illustrated in FIG. 24, the metallizations 19 are substantially identical to the metallizations 19 manufactured in the second embodiment in the step depicted in FIG. 2 with the difference that the metallizations 19 shown in FIG. 24 are realized on and in contact with the bumps 35.

Figure 25:
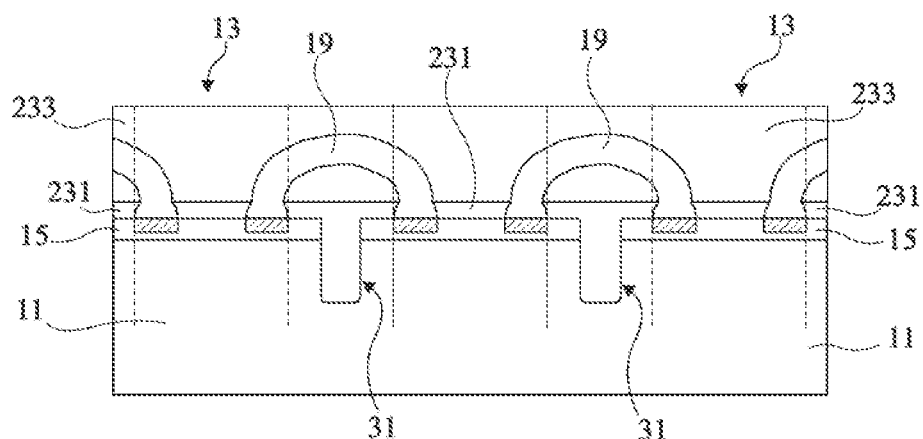
FIG. 25 depicts, via a sectional view, a further step of the method for manufacturing electronic chips according to the third embodiment.

FIG. 25 depicts, via a sectional view, a further step of the method for manufacturing electronic chips according to the third embodiment.

More specifically, FIG. 25 depicts via a partial and schematic view a step of depositing a second layer 233 of the first resin on the front face of the structure obtained at the end of the steps shown in FIGS. 19 to 24.

The front face of the structure is entirely covered (full wafer), and in particular the first layer 231 and the metallizations 19 are covered by the second layer 233 of the first resin.

Figure 26:
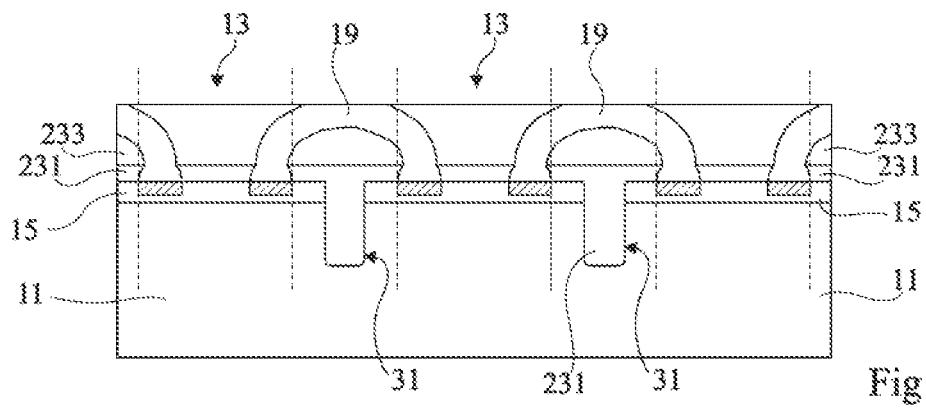
FIG. 26 depicts, via a sectional view, a further step of the method for manufacturing electronic chips according to the third embodiment.

FIG. 26 depicts, via a sectional view, a further step of the method for manufacturing electronic chips according to the third embodiment.

More specifically, FIG. 26 depicts via a partial and schematic view a step of planarizing the front face of the structure obtained at the end of the steps shown in FIGS. 19 to 25, for example by chemical mechanical polishing (CMP). During this step, an upper part of the layer 23 of the first resin is removed, so as to uncover the metallizations 19.

This step is substantially identical to the step of planarization of the second embodiment depicted in FIG. 15.

Figure 27:
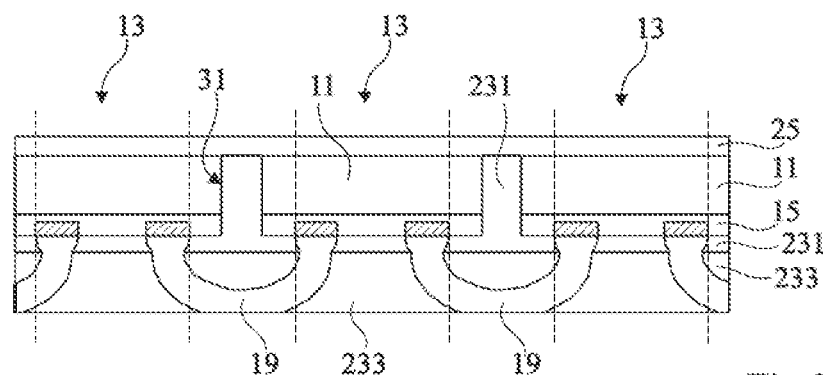
FIG. 27 depicts, via a sectional view, a further step of the method for manufacturing electronic chips according to the third embodiment.

FIG. 27 depicts, via a sectional view, a further step of the method for manufacturing electronic chips according to the third embodiment.

More specifically, FIG. 27 depicts via a partial and schematic view a step of thinning the structure, obtained at the end of the steps shown in FIGS. 19 to 26, via its rear face, and a step of depositing a third layer 25 of a second resin, on the rear face of the structure.

It should be noted that, in the example shown in FIG. 27, the orientation of the structures is reversed with respect to the sectional views shown in the preceding figures.

This step is substantially identical to the steps depicted in FIGS. 16 and 17 of the method according to the second embodiment.

Figure 28:
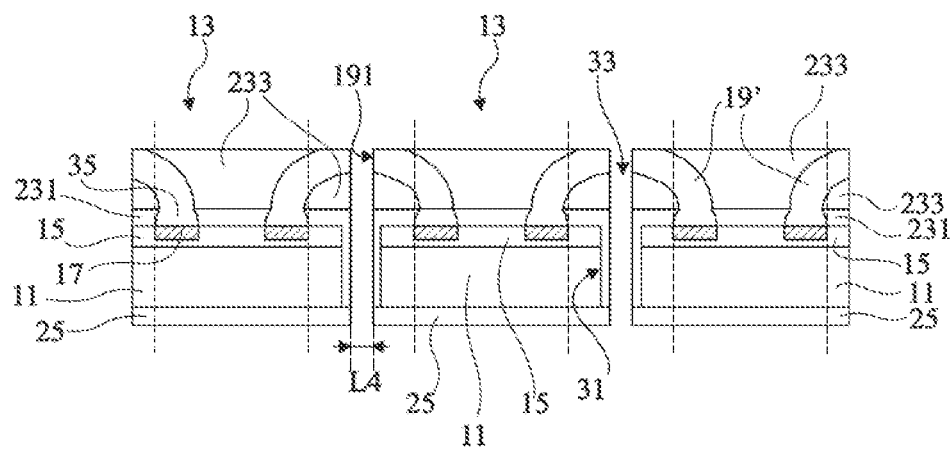
FIG. 28 depicts, via a sectional view, a further step of the method for manufacturing electronic chips according to the third embodiment.

FIG. 28 depicts, via a sectional view, a further step of the method for manufacturing electronic chips according to the third embodiment.

More specifically, FIG. 28 depicts via a partial and schematic view a step of cutting the structure into individual chips each comprising a single integrated circuit 13.

This step is substantially identical to the step depicted in FIG. 18 of the method according to the second embodiment.

An advantage of the second and third embodiments is that they make it possible to form electronic chips possessing wettable flanks without steps.

FIGS. 29 to 36 depict, in a schematic and partial fashion, successive steps of an example of a method for manufacturing electronic chips according to a fourth embodiment.

The fourth embodiment differs from the second embodiment essentially by the shape and the arrangement of the metallizations 19.

Figure 29:
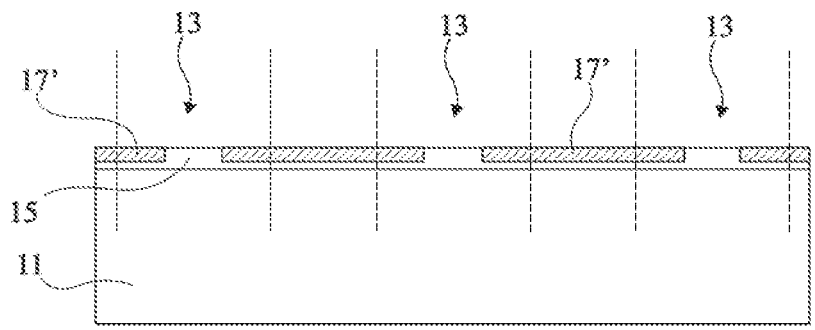
FIG. 29 depicts, via a sectional view, a step of a method for manufacturing electronic chips according to a fourth embodiment.

FIG. 29 depicts, via a sectional view, a step of the method for manufacturing electronic chips according to a fourth embodiment.

More specifically, FIG. 19 depicts via a partial and schematic view an initial structure identical to the initial structure of the method according to the second embodiment, illustrated in FIG. 11, with the difference that the circuits are coupled to one another by a same conductive zone 17' intended to define the pads 17 and coupling two adjacent circuits 13.

Figure 30:
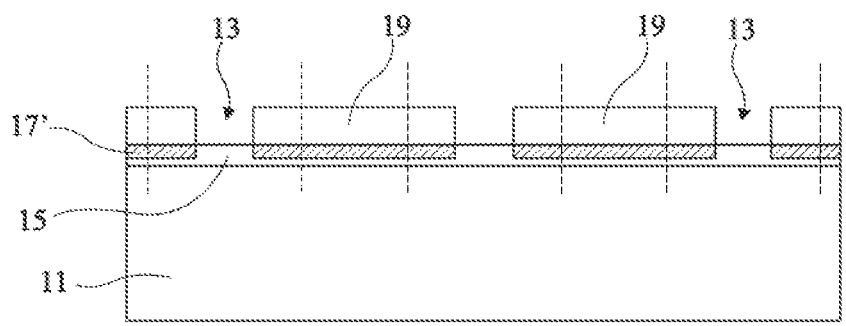
FIG. 30 depicts, via a sectional view, a further step of the method for manufacturing electronic chips according to the fourth embodiment.

FIG. 30 depicts, via a sectional view, a further step of the method for manufacturing electronic chips according to the fourth embodiment.

More specifically, FIG. 30 depicts a partial and schematic view a step of forming metallizations 19 on and in contact with the zone 17'.

The metallizations 19 are manufactured by a metal deposition, on and in contact with the zones 17', through a mask. The deposited metal is guided by an opening of the mask across from the zones 17'. The height of metallizations 19 is, for example, comprised between approximatively 1 µm and approximately 100 µm.

The metallizations 19 can be made of a tin-based alloy, for example an alloy based on tin and silver (SnAg). As an alternative, the metallizations 19 can be made of a copper-based alloy.

Figure 31:
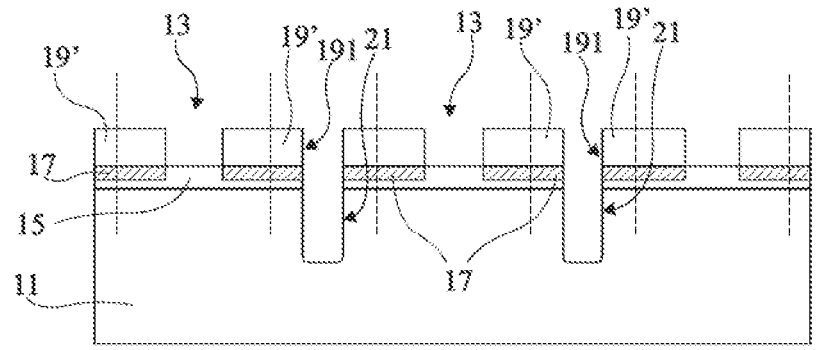
FIG. 31 depicts, via a sectional view, a further step of the method for manufacturing electronic chips according to the fourth embodiment.

FIG. 31 depicts, via a sectional view, a further step of the method for manufacturing electronic chips according to the fourth embodiment.

More specifically, FIG. 31 depicts via a partial and schematic view a step of forming first trenches 21 in the upper face of the structure obtained at the end of the steps shown in FIGS. 29 to 30.

The first trenches 21, formed in the fourth embodiment in the step depicted in FIG. 31, are substantially identical to the first trenches 21 formed in the first embodiment in the step depicted in FIG. 4, with the difference that the metallizations 19 have, for example, the shape of a parallelepiped, and not the shape of a ring part or bridge.

At the end of this step, the structure comprises portions 19' of metallizations 19.

Figure 32:
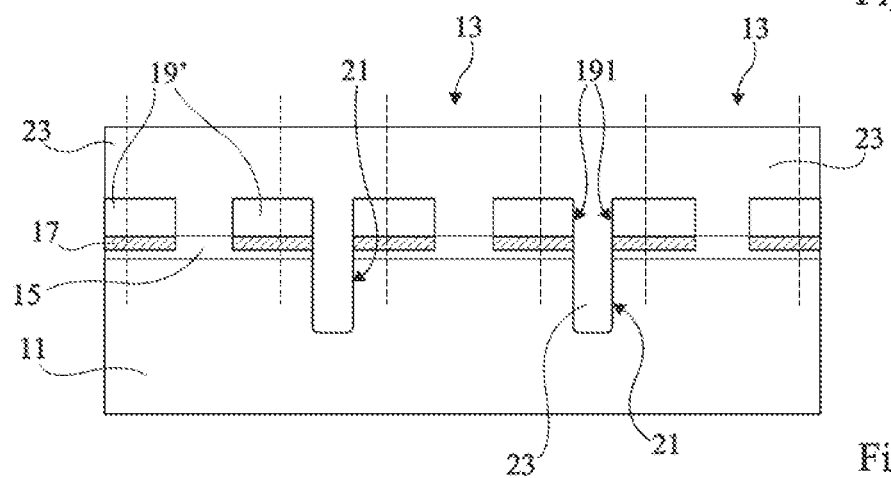
FIG. 32 depicts, via a sectional view, a further step of the method for manufacturing electronic chips according to the fourth embodiment.

FIG. 32 depicts, via a sectional view, a further step of the method for manufacturing electronic chips according to the fourth embodiment.

More specifically, FIG. 32 depicts via a partial and schematic view a step of depositing a layer 23 of a first resin on the front face of the structure obtained at the end of the steps shown in FIGS. 29 to 31.

This step is substantially identical to the step depicted in FIG. 6 of the method according to the first embodiment.

Figure 33:
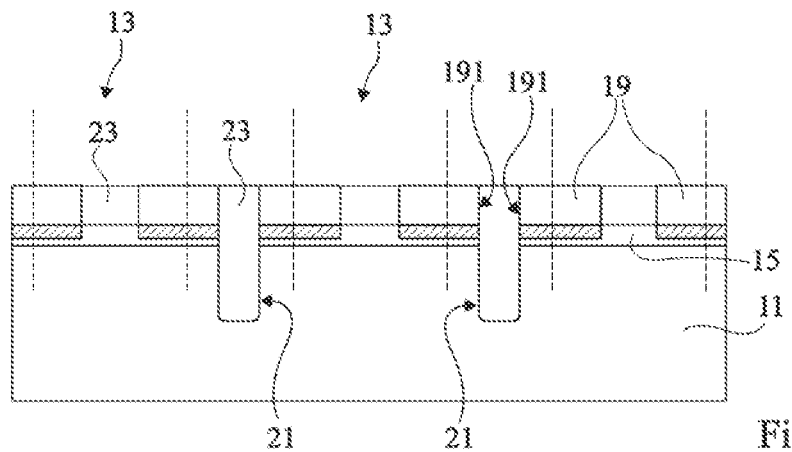
FIG. 33 depicts, via a sectional view, a further step of the method for manufacturing electronic chips according to the fourth embodiment.

FIG. 33 depicts, via a sectional view, a further step of the method for manufacturing electronic chips according to the fourth embodiment.

More specifically, FIG. 33 depicts via a partial and schematic view, a step of planarizing the front face of the structure obtained at the end of the steps shown in FIGS. 29 to 32, for example by chemical mechanical polishing (CMP).

During this step, an upper part of the layer 23 is removed, so as to uncover at least the portions 19' of the metallizations 19.

Figure 34:
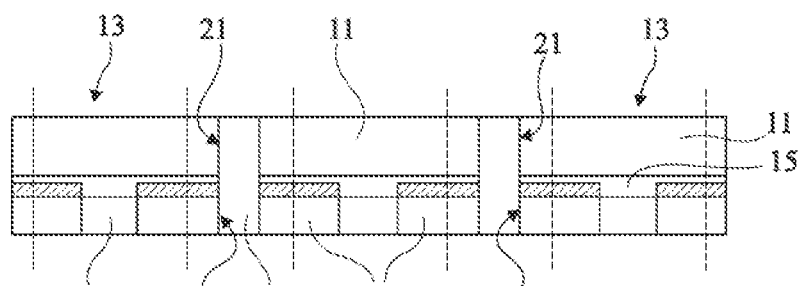
FIG. 34 depicts, via a sectional view, a further step of the method for manufacturing electronic chips according to the fourth embodiment.

FIG. 34 depicts, via a sectional view, a further step of the method for manufacturing electronic chips according to the fourth embodiment.

More specifically, FIG. 34 depicts via a partial and schematic view a step of thinning the structure obtained at the end of the steps shown in FIGS. 29 to 33, via its rear face.

It should be noted that, in the example shown in FIG. 34, the orientation of the structure is reversed with respect to the sectional views shown in the preceding figures.

This step is substantially identical to the step depicted in FIG. 8 of the method according to the first embodiment.

Figure 35:
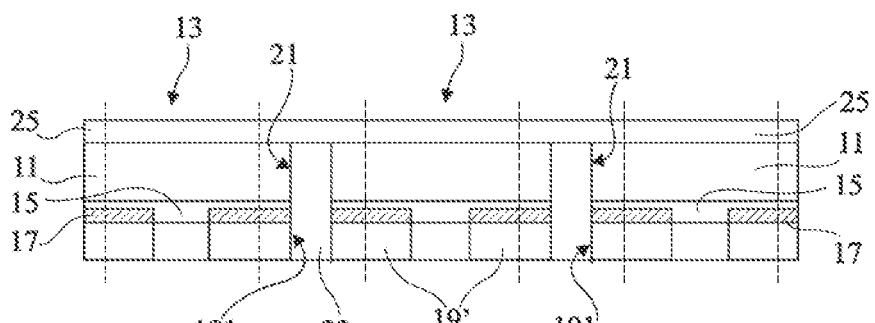
FIG. 35 depicts, via a sectional view, a further step of the method for manufacturing electronic chips according to the fourth embodiment.

FIG. 35 depicts, via a sectional view, a further step of the method for manufacturing electronic chips according to the fourth embodiment.

More specifically, FIG. 35 is a partial and sectional view, in the same orientation as FIG. 34, depicting a step of depositing a layer 25 of a second resin on the rear face of the structure obtained at the end of the steps shown in FIGS. 29 to 34.

This step is substantially identical to the step depicted in FIG. 9 of the method according to the first embodiment.

Figure 36:
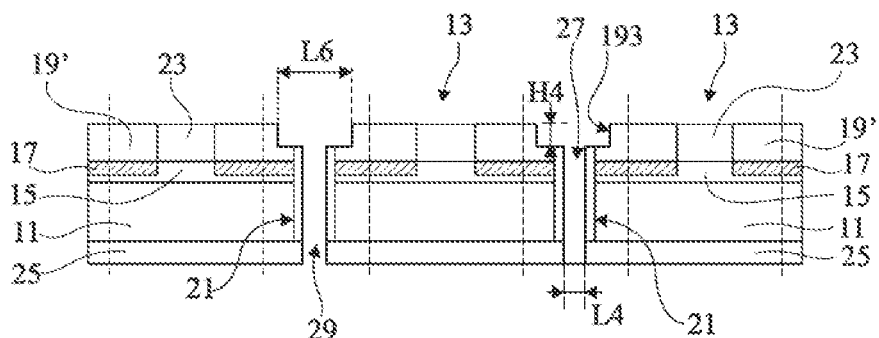
FIG. 36 depicts, via a sectional view, a further step of the method for manufacturing electronic chips according to the fourth embodiment.

FIG. 36 depicts, via a sectional view, a further step of the method for manufacturing electronic chips according to the fourth embodiment.

More specifically, FIG. 36 depicts via a partial and schematic view a step of forming, on the side of the front face of the structure obtained at the end of the steps shown in FIGS. 29 to 35, openings 27 and a step of cutting the structure into individual chips each comprising a single integrated circuit 13. Prior to this step, the structure is placed, via its rear face, on a support film 21, not illustrated in FIG. 36.

The openings 27, formed in the fourth embodiment in the step depicted in FIG. 36, are substantially identical to the openings 27 formed in the first embodiment in the step depicted in FIG. 10, with the difference of the shape of the portions 19' of metallizations 19. The dimensions of the openings 27 formed in the fourth embodiment are chosen in the same manner as the dimensions of the openings 27 formed in the first embodiment. However, considering the difference in shape of the openings 27 between these two embodiments, their dimensions are not numerically identical.

The openings 27 extend vertically, from the front face of the structure, over a depth H4 and a width L6. For instance, the depth H4 is less than or equal to the residual height of the portions 19' of metallizations 19. The depth H4 is, for example, in the order of 100 μm.

The openings 27 have a width L6, for example comprised between approximately 15 μm and approximately 80 μm, in some embodiments comprised between approximately 40 μm and approximately 50 μm, the width L6 in some embodiments being equal to approximately 45 μm, for example equal to 45 μm.

In order to cut the structure into individual chips each comprising a single integrated circuit 13, cutting lines 29 are realized in the first and second resins, across from the first trenches 21 and the openings 27.

The cutting lines 29 illustrated in FIG. 36 are substantially identical to the cutting lines 29 of the step of the first embodiment depicted in FIG. 10.

At the end of this step, the obtained structure corresponds to a plurality of electronic chips coupled solely by the support film (not illustrated in FIG. 36). The flanks of the portions 19' exposed in the step of forming the openings 27 correspond to wettable flanks of the chips.

The chips can then be taken from the support film 10, not illustrated in FIG. 10, with a view to their mounting in an external device.

As an alternative, the manufacture of the openings 27 can be carried out from the end of the step depicted in FIG. 32.

Figure 37:
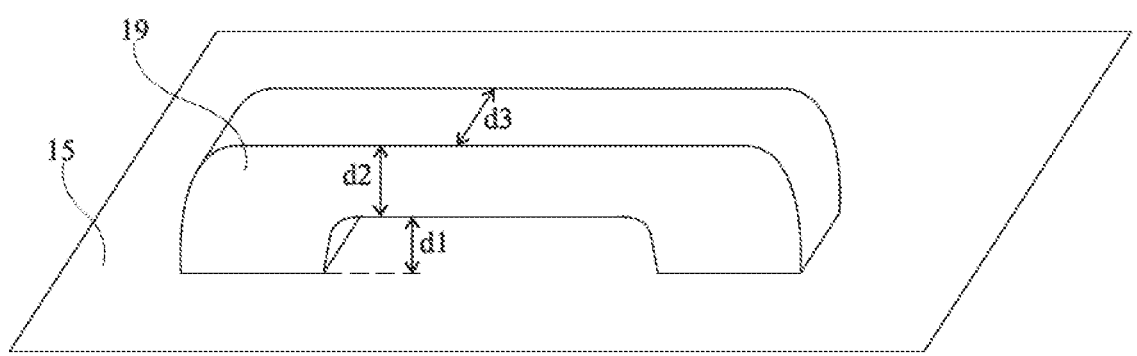
FIG. 37 illustrates, via a perspective view, an alternative embodiment.

FIG. 37 illustrates, via a perspective view, an alternative embodiment.

More specifically, FIG. 37 illustrates an alternative embodiment of a metallization 19.

The metallization 19, depicted in FIG. 37, has the shape of a non-rounded bridge the upper face of which is almost flat.

The metallization 19 is characterized by its height d1 which separates the layer 15 from the lower face of its central part. The height d1 is, for example, comprised between approximately 5 μm and approximately 70 μm, in some embodiments comprised between approximately 15 μm and approximately 50 μm.

The metallization 19 is additionally characterized by its thickness d2 through its central (horizontal) part. The thickness d2 is, for example, comprised between approximately 20 μm and approximately 400 μm, in some embodiments comprised between approximately 50 μm and approximately 250 μm.

The metallization 19 is further characterized by its width d3. The width d3 is, for example, comprised between approximately 20 μm and approximately 600 μm, in some embodiments comprised between approximately 50 μm and approximately 400 μm.

Various embodiments and alternatives have been described. Those skilled in the art will understand that certain features of these embodiments can be combined and other alternatives will readily occur to those skilled in the art. In particular, the first and third embodiments can be combined and the second and fourth embodiments can also be combined. The described embodiments are not limited to the example dimensions and materials mentioned above.

Finally, the practical implementation of the embodiments and alternatives described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing electronic chips, comprising:
    forming on a first face of a semiconductor substrate a plurality of metallizations, the metallizations coupling respective contacts of adjacent integrated circuits on the substrate to one another; and
    forming first trenches extending through the first face of the substrate and laterally separating the adjacent integrated circuits, the first trenches extending through the metallizations coupling the respective contacts of the adjacent integrated circuits, in order to form at least a portion of metallizations at each of the adjacent circuits;
    forming a layer of a first resin over the entire first face, the first resin penetrating into the first trenches and covering the portions of the metallizations.

2. The method according to claim 1, wherein the forming the metallizations is followed by the forming the first trenches.

3. The method according to claim 2, wherein the first trenches extend vertically in the substrate to a depth that is greater than that of the integrated circuits and less than a thickness of the substrate.

4. The method according to claim 3, further comprising:
    planarizing the first face until the portions of the metallizations are uncovered.

5. The method according to claim 4, further comprising:
    thinning the substrate from a second face of the substrate, located opposite the first face, at least until the first resin is reached; and
    depositing a layer of a second resin over the second face.

6. The method according to claim 4, wherein the planarizing the first face is carried out until the portions of the metallizations are uncovered over a surface area sufficient to solder the chip, by its first face, onto a device different from the chip.

7. The method according to claim 4, wherein the planarizing the first face is carried out until the portions of the metallizations are uncovered over a length greater than approximately 20 μm.

8. The method of claim 1, wherein forming on the first face of a semiconductor substrate the plurality of metallizations further includes forming the plurality of metallizations having a curved structure.

9. A method for manufacturing electronic chips, comprising:
    forming first trenches extending through a first face of a semiconductor substrate, the first trenches laterally separating adjacent integrated circuits on the substrate from one another, the first trenches extending vertically in the substrate to a depth that is greater than that of the integrated circuits and less than a thickness of the substrate;
    forming on the first face of a semiconductor substrate metallizations, the metallizations coupling respective contacts of the adjacent integrated circuits on the substrate to one another; and
    forming second trenches extending through the metallizations coupling the respective contacts of the adjacent integrated circuits, in order to form at least a portion of metallizations at each of the adjacent circuits.

10. The method according to claim 9, further comprising:

depositing a layer of a first resin over the entire first face of the substrate, the first resin penetrating into the first trenches and covering the portions of the metallizations.

11. The method according to claim 10, further comprising:

uncovering each of the metallizations by planarizing the first face, the metallizations being uncovered over a length greater than approximately 200 µm.

12. The method according to claim 11, further comprising:

forming openings by partially removing the layer of the first resin, over a height less than or equal to the height of the portions of the metallizations, the openings located across the second trenches and extending over a width greater than or equal to that of the second trenches, so as to free a flank of at least a portion of each integrated circuit; and individualizing the chips by cutting along a cutting path in the first trenches, over a width less than the width of the first trenches.

13. The method according to claim 11, further comprising:

thinning the substrate from a second face of the substrate, located opposite the first face, at least until the first resin is reached; and depositing a layer of a second resin over the second face.

14. The method according to claim 13, wherein the thinning the substrate from the second face of the substrate is performed prior to the forming the second trenches.

15. The method according to claim 9, further comprising:

forming bumps in vertical alignment with the integrated circuits prior to the forming the first trenches;

depositing a first layer of a first resin over the entire first face prior to the forming the metallizations, the first resin penetrating into the first trenches and covering the bumps; and uncovering the bumps by planarizing the first layer.

16. The method according to claim 15, wherein the metallizations are coupled to the integrated circuits by the bumps.

17. The method according to claim 15, further comprising:

depositing a second layer of the first resin over the first layer of the first resin.

18. A method, comprising:

forming a plurality of metallizations on a first face of a semiconductor substrate metallizations, each of the metallizations coupling respective contacts of adjacent integrated circuits on the substrate to one another, the metallizations being spaced apart from the first face of the semiconductor substrate between the adjacent integrated circuits;

forming trenches extending through the first face of the substrate and laterally separating the adjacent integrated circuits, the trenches extending through the metallizations between the adjacent integrated circuits;

forming an insulating layer on the first face of the semiconductor substrate, the insulating layer extending into the trenches and between the adjacent integrated circuits; and cutting through the semiconductor substrate along the trenches.

19. The method according to claim 18, further comprising:

forming openings by removing portions of the insulating layer between portions of the metallizations between the adjacent integrated circuits, the openings a greater width than that of the trenches.

20. The method according to claim 19, further comprising:

partially exposing surfaces of the metallizations by planarizing the insulating layer, prior to the forming the openings.

* * * * *